United States Patent
Lynch et al.

(10) Patent No.: US 7,403,076 B1
(45) Date of Patent: Jul. 22, 2008

(54) HIGH FREQUENCY QUASI OPTICAL POWER SOURCE CAPABLE OF SOLID STATE IMPLEMENTATION

(75) Inventors: Jonathan J. Lynch, Oxnard, CA (US); Daniel F. Sievenpiper, Santa Monica, CA (US); Joseph S. Colburn, Pacific Palisades, CA (US)

(73) Assignee: HRL Laboratories, LLC, Malibu, CA (US)

(*) Notice: Subject to any disclaimer, the term of this patent is extended or adjusted under 35 U.S.C. 154(b) by 357 days.

(21) Appl. No.: 11/347,330

(22) Filed: Feb. 3, 2006

(51) Int. Cl.
*H03B 9/01* (2006.01)
*H01S 3/00* (2006.01)

(52) U.S. Cl. .................. 331/96; 331/79; 359/333

(58) Field of Classification Search ............ 331/6, 331/79, 80, 81, 82, 96, 97, 104; 343/786, 343/753, 755, 756, 767, 772, 781 R, 781 P, 343/700 MS; 333/31 A, 134; 342/361; 359/333
See application file for complete search history.

(56) References Cited

U.S. PATENT DOCUMENTS

| | | | |
|---|---|---|---|
| 5,392,152 | A | 2/1995 | Higgins et al. |
| 5,900,965 | A | 5/1999 | Matkin et al. |
| 6,538,793 | B2 | 3/2003 | Rosenberg et al. |
| 6,559,724 | B2 | 5/2003 | Rosenberg et al. |
| 7,184,205 | B1 | 2/2007 | Lynch |
| 2002/0024387 | A1 | 2/2002 | Deckman et al. |
| 2003/0043466 | A1 | 3/2003 | Crouch et al. |
| 2003/0076192 | A1 | 4/2003 | DeLisio, Jr. et al. |
| 2003/0214450 | A1 | 11/2003 | Lynch et al. |
| 2007/0176700 | A1* | 8/2007 | Gallivan et al. ......... 331/107 A |

OTHER PUBLICATIONS

Rutledge et al., "Active Grids for Quasi-Optical Power Combining", Oct. 1995, ISSSE '95, Proceedings., 1995 URSI International Symposium on Signals, Systems, and Electronics, pp. 141-144.*

* cited by examiner

*Primary Examiner*—Robert J. Pascal
*Assistant Examiner*—Ryan J Johnson
(74) *Attorney, Agent, or Firm*—Christopher R. Balzan

(57) ABSTRACT

In one embodiment, a high frequency quasi optical oscillator power source is provided which includes an array of amplifier devices each having an input antenna tuned for a fundamental frequency. A amplifier coupled to the input antenna amplifies fundamental frequency signals. A multiplier coupled to the amplifier provides signals at a multiple of the fundamental frequency and at the fundamental frequency. The output antenna coupled to the multiplier is tuned at the fundamental frequency and at a multiple of the fundamental frequency. A grating lobe-to-main lobe converter located above the array of amplifier devices converts grating lobe power to main lobe power at the multiple of the fundamental frequency. A frequency selective reflector opposes the amplifier array to reflect signals at the fundamental frequency and to pass signals at the multiple of the fundamental frequency.

29 Claims, 3 Drawing Sheets

HIGH FREQUENCY QUASI OPTICAL POWER SOURCE CAPABLE OF SOLID STATE IMPLEMENTATION

CROSS REFERENCE TO RELATED APPLICATIONS

This application is related to U.S. application Ser. No. 11/347,707 filed the same date as the present application, by Lynch, entitled STRUCTURE FOR COUPLING POWER; and related to U.S. application Ser. No. 11/347,709, issued as U.S. Pat. No. 7,184,205, filed the same date as the present application, by Lynch, entitled ELECTROMAGNETIC ARRAY STRUCTURE CAPABLE OF OPERATING AS AN AMPLIFIER OR AN OSCILLATOR; both herein incorporated by reference in their entireties.

BACKGROUND

Solid state millimeter wave sources have generally relied on power combining to achieve useful power levels (>milliwatts). Printed circuit or waveguide combining is typically used at lower frequencies (e.g.)<75 Ghz). At higher frequencies, however, these method are either very inefficient due to high losses, or are difficult to fabricate due to tight mechanical tolerances.

Free space combining, also called "quasi optical" combining, eliminates the latter problem by allowing electromagnetic energy to combine in free space. Quasi optical approaches have been know to provide higher efficiency by utilizing free space combining, but solid state devices cannot produce much power above 100 Ghz. Frequency triplers have been used to produce high frequency power, even in array form, but such "quasi optical" approaches have not utilized monolithic integration of triplers with power amplifiers in array form. One reason this has not been attempted is the tight array spacing at $3f_0$ severely restricts the available real estate for the received antennas, amplifier, and tripler circuitry. Standard array approaches require the radiating elements at $3f_0$ to be closely spaced (nine per unit cell) to avoid grating lobes. At high frequencies, there is insufficient real estate to fit all of the required circuitry together with the antenna elements on a monolithic device.

The availability of high power at high frequencies may be useful in communications above 100 GHz range, directed energy beams, room temperature submillimeter wave imaging, chemical and biological sensing, and high angular resolution and compact radar. Other applications may include for example, concealed weapons detection, driver vision assist in fog, landing aid for aircraft and helicopters, biological and chemical agents detection, missile seeker radar, and remote sensing. Other implementations are possible.

Thus, there is need for a compact high power high frequency source.

SUMMARY

In one embodiment, a high frequency quasi optical oscillator power source is provided. The power source includes an array of amplifier devices each having an input antenna tuned to receive an input signal at a fundamental frequency. A power amplifier coupled to the input antenna is capable of amplifying the input signals at the fundamental frequency. A frequency multiplier coupled to the power amplifier is capable of providing signals at a multiple of the fundamental frequency and at the fundamental frequency. The output antenna is coupled to the frequency multiplier and tuned to radiate signals at the fundamental frequency and at the multiple of the fundamental frequency. A grating lobe-to-main lobe converter located above the array of amplifier devices is adapted to convert grating lobe power to main lobe power at the multiple of the fundamental frequency. A frequency selective reflector opposes the array of amplifier devices and is adapted to reflect signals at the fundamental frequency and to pass signals at the multiple of the fundamental frequency.

BRIEF DESCRIPTION OF THE DRAWINGS

The features and advantages of the present invention will be better understood with regard to the following description, appended claims, and accompanying drawings where:

DESCRIPTION

Figure 1:
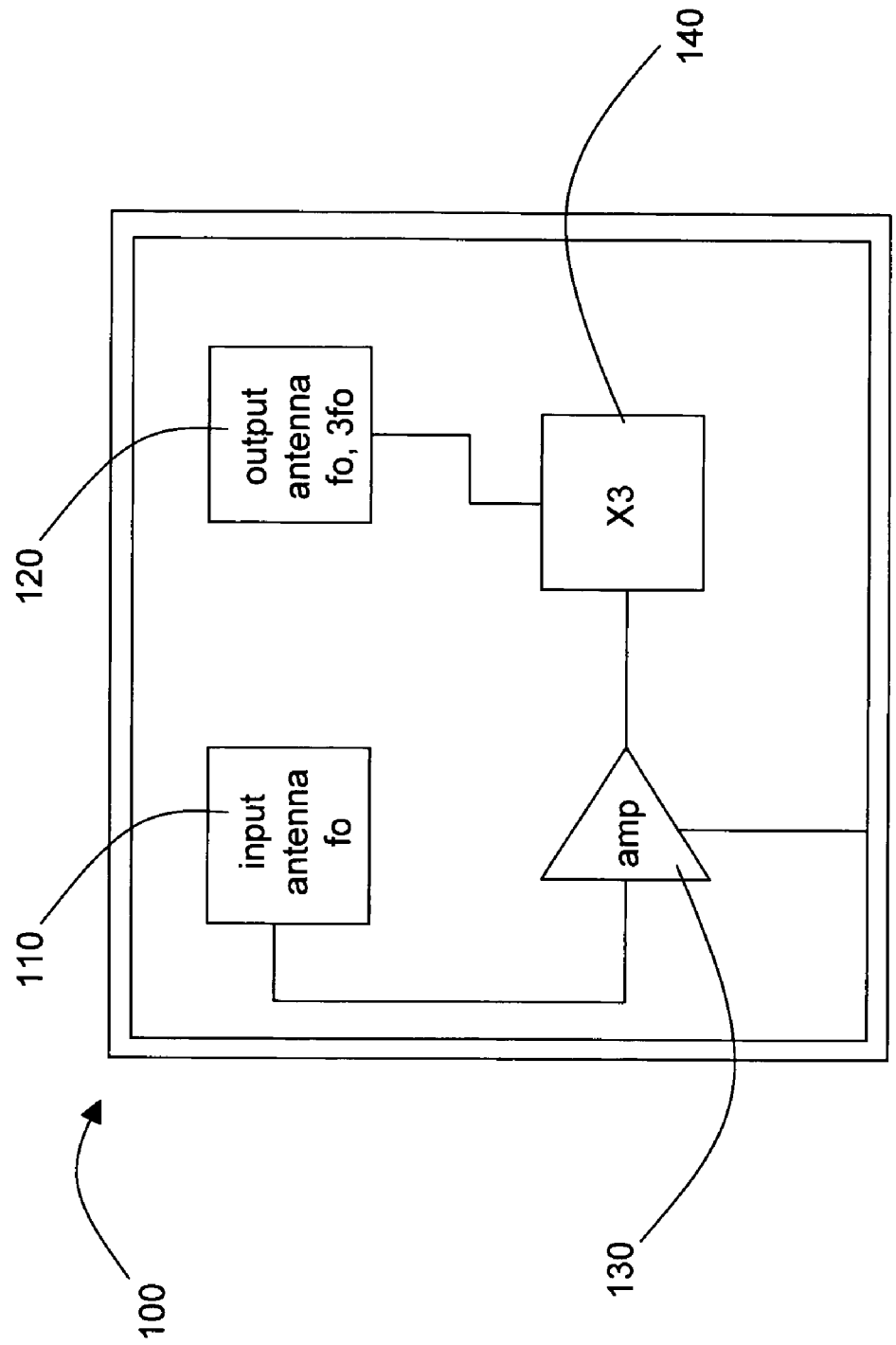
FIG. 1 shows a top view of a single unit cell in accordance with one embodiment of the present invention.

A millimeter wave power source may be constructed with an array of spaced unit cells, such as is illustrated and described in U.S. application Ser. No. 11/347,707, filed on the same date as the present application, by Lynch, entitled STRUCTURE FOR COUPLING POWER, and U.S. application Ser. No. 11/347,709, issued as U.S. Pat. No. 7,184,205, filed on the same date as the present application, by Lynch, entitled ELECTROMAGNETIC ARRAY STRUCTURE CAPABLE OF OPERATING AS AN AMPLIFIER OR AN OSCILLATOR, which are both incorporated by reference FIG. 1 shows a top view of a single unit cell 100 in accordance with one embodiment of the present invention. The unit cell 100 may be part of array 210 (shown in FIG. 2) of unit cells 100. In the embodiment shown in FIG. 1, the unit cell 100 includes input and output antennas 110 and 120 respectively, which are typically patch antennas, oriented so that the receive input is cross polarized with respect to the transmit output. Shown in FIG. 1, the input antenna 110 is oriented to receive signals polarized in the horizontal direction, and the output antenna 120 is oriented to provide signals polarized in the vertical direction. The input and output antennas 110 and 120 do not have to be cross polarized, but cross polarizing them reduces parasitic coupling and bives better coupling control. Furthermore, other antenna types are possible. For example, horn, slot, cavity, back slot, cavity backed patch, dipole, or other antennas are possible.

In the embodiment of FIG. 1, the input antenna 110 is tuned to a fundamental frequency $f_0$, while the output antenna 120 is a dual frequency antenna, with good radiation efficiency at the fundamental frequency $f_0$, and at a multiple of the fundamental frequency, which in embodiment shown in FIG. 1 is at the third harmonic $3f_0$. The input antenna 110 feeds power to an amplifier 130.

The amplifier 130 is coupled between the input antenna 110 and a frequency tripler 140. The amplifier 130 provides power at $f_0$ to the frequency tripler 140, which radiates both $f_0$ and $3f_0$. The amplifier 130 may be constructed with a number of stages of amplification and power output stage. In one embodiment, the amplifier 130 includes a two stage InP double-heterojunction bipolar transistor or DHBT. A bias grid 150 supplies electrical power to the amplifier 130. The bias grid 150 may have filter capacitors and resistors along the bias lines, and a bias line decoupling method for monolithic amplifier arrays as disclosed in U.S. patent application Ser. No. 10/664,112, filed on Sep. 17, 2003, by Jonathan Lynch, herein incorporated by reference in its entirety.

Figure 2:
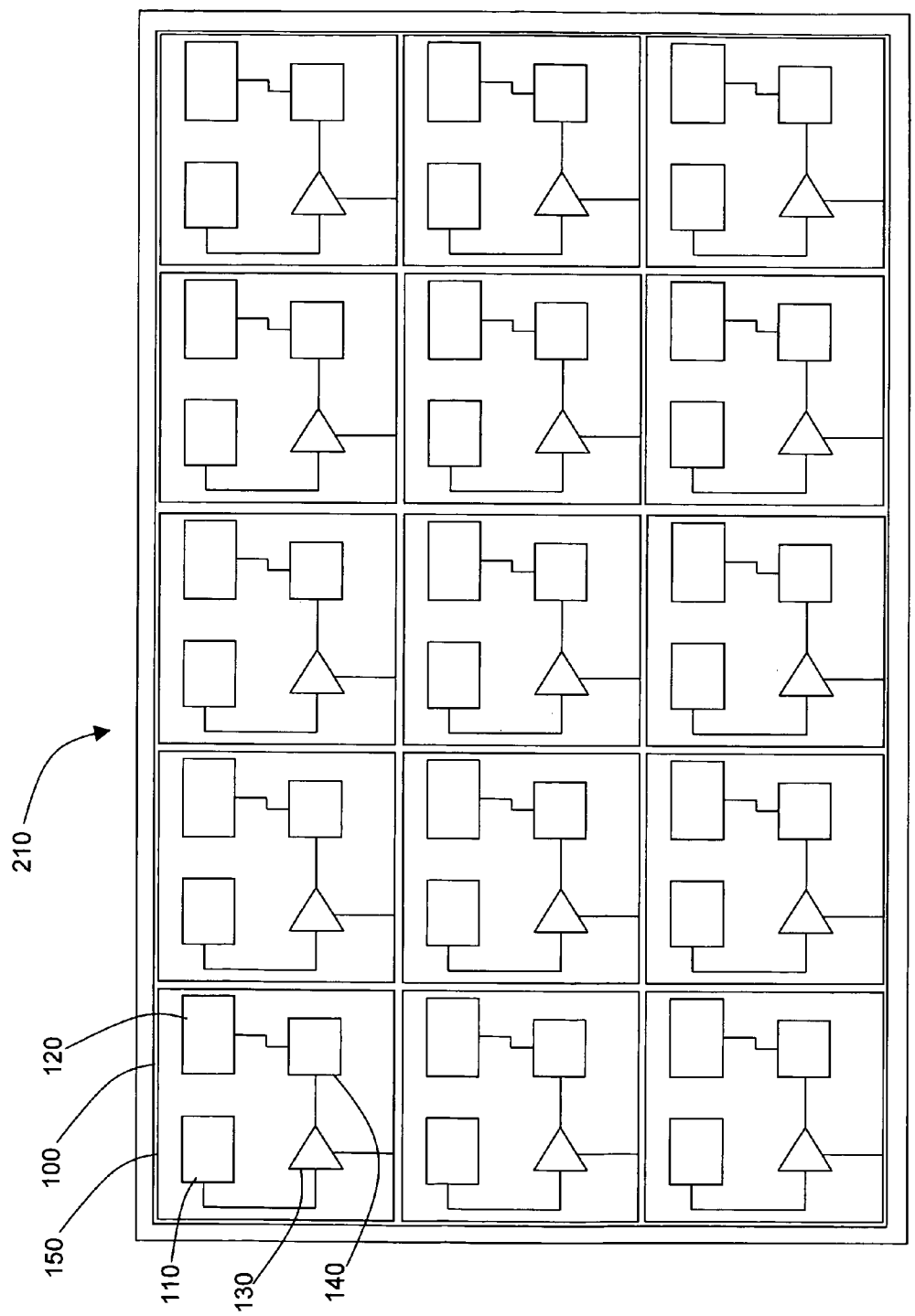
FIG. 2 shows a top view of an array in accordance with one possible embodiment of the present invention.

FIG. 2 shows a top view of an array 210 of unit cells 100 in accordance with one possible embodiment of the present invention. The spacing of the unit cells 100 in the array 210 is $$\frac{\lambda}{2}$$

at $f_0$, so the receive pattern (amplifier 130 input) is free of grating lobes, but the transmit pattern (tripler 140 output) contains grating lobes in the horizontal plane (the vertical plane transmit antenna spacing is $$\frac{\lambda}{2}$$

at $3f_0$). The input antennas 110 associated with the array 210 of unit cells 100 absorb the power from the impinging plane waves, and feed that power to its respective amplifier 130.

Figure 3:
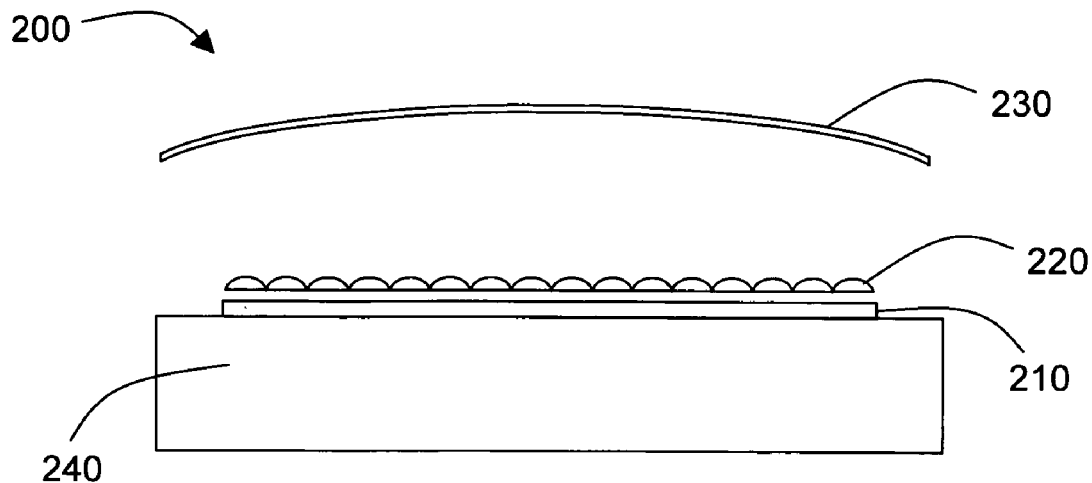
FIG. 3 shows a side view of one possible configuration of a high power quasi optical power source in accordance with an embodiment of the present invention.

FIG. 3 shows a side view of one possible configuration of a high power quasi optical power source 200 in accordance with an embodiment of the present invention. In some embodiments, the array 210 may be fabricated in a monolithic design on a single wafer. The array 210 may be bonded to an optional heatsink 240 for thermal dissipation. A grating lobe-to-main lobe converter 220 is located above the array 210. The grating lobe-to-main lobe converter 220 may be a dielectric, a patterned material, or other structure that is designed to pass main lobe energy, and to convert the grating lobe energy into main lobe energy at $3f_0$, for the above example embodiment. Referring to FIGS. 2 and 3, the grating lobe-to-main lobe converter 220 may be an array with multiple grating lobe-to-main lobe converters located above and corresponding with the unit cells 100 of the unit cell array 210. Thus, the grating lobe-to-main lobe converter 220 may be periodic having individual converters spaced $$\frac{\lambda}{2}$$

apart at $f_0$ above the unit cells 100, and can be a shaped dielectric (such as a spheroidal, a hemispherical, a traditional lens shape, or other shape), or a patterned material surface (analogous to a frequency selective surface). The shape of grating lobe-to-main lobe converters may be tailored to optimize redirection of grating lobe energy to the main lobe.

Note that the period of the structure of the grating lobe-to-main lobe converter 220 inhibits additional lobes from being generated in the receive pattern at $f_0$. The input impedance of the input antennas 110, however, may have to be modified slightly to account for any reflections off of the grating lobe-to-main lobe converter 220. For example, the patch antenna may be modified so that the interface between the transmission line and the patch antenna is inset an appropriate distance within the perimeter of patch antenna, such that the transmission line connects with the patch antenna within a recess (not shown in FIG. 1) in the patch antenna.

Figure 4:
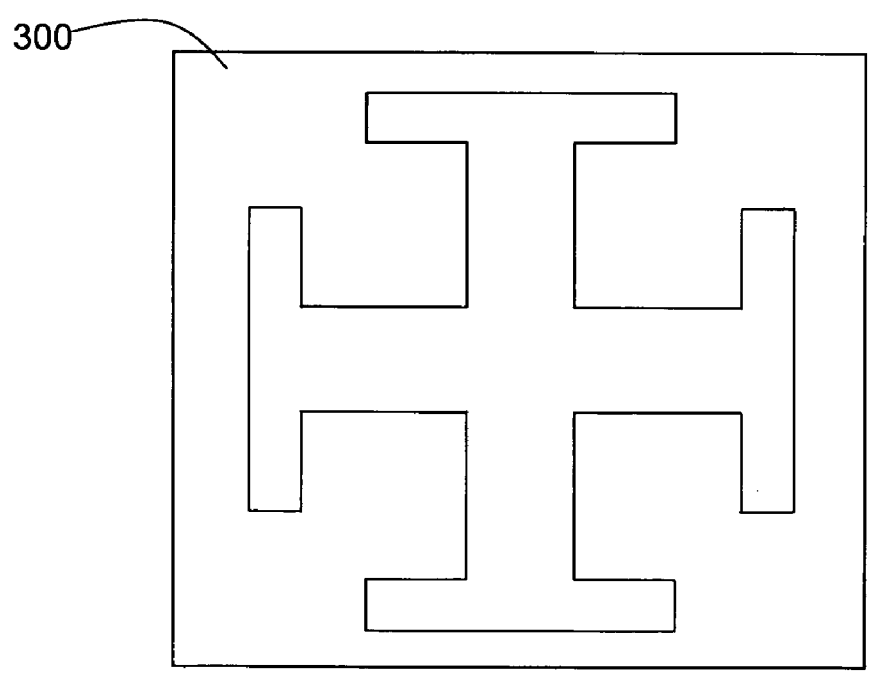
FIG. 4 shows one potential example of a frequency selective surface metal pattern capable of use as part of a partial reflector in one embodiment of the invention.

A shaped partial reflector 230 is located above the grating lobe-to-main lobe converter 220 and is designed so that it reflects energy at $f_0$ to provide feedback and coupling between all of the array elements, and to pass energy at $3f_0$ to provide output power. This partial reflector 230 may include a parabolic reflector with a metal pattern on the surface that creates the reflection/transmission properties described above. One potential example of a frequency selective surface metal pattern 300 that accomplishes this is shown in FIG. 4. The parabolic shape of the partial reflector 230 helps ensure that the array of oscillators will synchronize in phase to provide efficient power combining. The signal at $f_0$ feeds back to the input antenna 110 after reflecting off the partial reflector 230. It is significant to note that the partial reflector 230 reflects back energy in the cross polarization in order to couple the output antennas 120 back to the input antennas 110. As such, the feedback loop at $f_0$ gives the oscillation, and the output at $3f_0$ passes through the partial reflector as output power.

To ensure oscillation, the loop gain through the amplifier 130, the tripler 140, out the output antenna 120, off the partial reflector 230, and back in the input antenna 110, must be greater than one. The phase in the loop is close to a multiple of 2pi at $f_0$. The phase may be adjusted by adjusting the spacing between the partial reflector 230 and the array 210. If the partial reflector 230 is moved ¼ wavelength with respect to the array 210 it passes through 180 degrees of phase change. Typically, the distance of the partial reflector 230 from the array 210 will be on the order of the width of the array 210.

The array 210 size may be set so that an incoming plane wave at $f_0$ is completely absorbed. For this, typically the unit cell is sized on a side, slightly above one half wavelength at $f_0$, but it may be sized somewhere between about one half wavelength and about one wavelength at $f_0$. The unit cell can be sized smaller than one half wavelength, but typically the unit cell is sized slightly greater than one half wavelength to provide room for the amplifier 130. When radiating at $3f_0$, however, because the wavelength is one third as long, the unit cells 100 are spaced too far apart to inhibit grating lobes. As a result, there is not only a beam at $3f_0$ straight up, but also grating lobes to the side at $3f_0$. The grating lobe-to-main lobe converter array 220 converts the grating lobe energy from each unit cell 100 and redirects it into the main lobe.

The partial reflector 230 has a grating or a frequency selective surface so that it reflects back all the energy at $f_0$, but is transparent at $3f_0$. It is expected that the unit cell size will probably be on the order of one half wavelength at $3f_0$. It could be a dielectric slab that is one half wavelength thick at $3f_0$, and transparent at $3f_0$, with the frequency selective surface facing the array 210.

An advantage of certain embodiments, is that the array of grating lobe-to-main lobe converters 220 redirects much of the energy from the grating lobes at $3f_0$, while still permitting the use of a quasi optical coupled oscillator array with global coupling to create source power. This is readily scalable to very large numbers of elements without suffering high combining losses. Further, some embodiments may be fabricated monolithically. Thus, some embodiments can generate significant power (>milliwatts) at millimeter wave (30 to 300 GHz) or submillimeter wave (300 to 3000 GHz) frequencies using solid state electronic devices.

As such, an array of synchronized oscillators may be utilized which operate at a lower frequency, $f_0$, to deliver power to a monolithic array of frequency multipliers, which in turn radiate energy into free space at frequency $3f_0$. Due to the in-phase synchronization of the oscillators, the power radiated by the frequency multipliers combine coherently and high output power is achievable by utilizing a large number of elements. An array of grating lobe-to-main lobe converters 220 in front of the array 210 converts the radiated grating lobe energy to main lobe energy, thus allowing efficient transfer of power in a controlled manner.

Certain embodiments may utilize semiconductor technology that is currently available (e.g. InP High Electron Mobility Transistors or HEMT, and InP Heterojunction Barrier Varactor or HBV diodes), along with a coupling and radiation scheme to coherently combine the power from a large number of individual unit cells to allow relatively large amounts of power (watts) to be generated at extremely high frequencies (>300 GHz) using a monolithic, wafer scale approach. The wafer level design allows high degree of device uniformity, and minimizes parasitics from off chip transitions (e.g. wire bonds).

Certain embodiments have the advantage of not requiring multiple output antennas 120 per unit cell 100 to reduce grating lobe energy. As a result, the number of antennas per unit cell 100 can be reduced, saving space to allow a compact high frequency power source. In one embodiment, the grating lobe-to-main lobe converter reduces the number of output antennas 120 from nine to one per unit cell 100.

Furthermore, some embodiments are able to generate higher powers. Because the amplifier 130 amplifies the signal at $f_0$, which is a much lower frequency than $3f_0$, the system is able to produce high power in a more compact and cost effective manner. Also, the unit cells 100 may be fabricated on a single wafer, which allows good process control of the geometries allowing larger numbers of the unit cells 100 to provide high power.

Having described this invention in connection with a number of embodiments, modification will now certainly suggest itself to those skilled in the art. As such, the invention is not to be limited to the disclosed embodiments except as required by the appended claims.

What is claimed is:

1. A high frequency quasi optical oscillator power source comprising:
   a) an array of amplifier devices each comprising:
      (i) an input antenna tuned to receive an input signal at a fundamental frequency;
      (ii) a power amplifier coupled to the input antenna capable of amplifying a signal at the fundamental frequency;
      (iii) a frequency multiplier capable of providing signals at a multiple of the fundamental frequency and at the fundamental frequency coupled to the power amplifier; and
      (iv) an output antenna coupled to the frequency multiplier and tuned to radiate signals at the fundamental frequency and at the multiple of the fundamental frequency;
   b) a grating lobe-to-main lobe converter located above the array of amplifier devices, the grating lobe-to-main lobe converter being adapted to convert grating lobe power to main lobe power at the multiple of the fundamental frequency; and
   c) a frequency selective reflector opposing the array of amplifier devices, the frequency selective reflector being adapted to reflect signals at the fundamental frequency and to pass signals at the multiple of the fundamental frequency.

2. The power source of claim 1 wherein the grating lobe-to-main lobe converter comprises an array of individual converters spaced a distance of one half wavelength at the fundamental frequency above the array of amplifier devices.

3. The power source of claim 2 wherein the individual converters comprise at least one of: (a) a shaped dielectric; or (b) a patterned material surface.

4. The power source of claim 1 wherein the grating lobe-to-main lobe converter comprises an array of grating lobe-to-main lobe converters spaced so as to inhibit grating lobes at the fundamental frequency.

5. The power source of claim 4 wherein each of the converters of the array of converters comprise at least one of: (a) shaped dielectrics; or (b) patterned material surfaces.

6. The power source of claim 1 wherein the grating lobe-to-main lobe converter comprises an array of spheroidal lenses positioned above the array of amplifier devices.

7. The power source of claim 6 wherein the grating lobe-to-main lobe converter comprises an array of hemispherical lenses positioned above the array of amplifier devices.

8. The power source of claim 1 wherein the frequency multiplier is a frequency tripler.

9. The power source of claim 1 wherein the output antenna is a single output antenna.

10. The power source of claim 1 wherein the array of amplifier devices are spaced so as to inhibit grating lobes at the fundamental frequency.

11. The power source of claim 10 wherein the output antenna is spaced with respect to other output antennas of the array of amplifier devices so as to inhibit grating lobes at the fundamental frequency.

12. The power source of claim 1 wherein the output antenna and the input antenna are oriented in a cross polarization configuration.

13. A high frequency quasi optical oscillator power source comprising:
   a) a grid array of amplifier devices each comprising:
      (i) an input antenna tuned to receive signals at a fundamental frequency;
      (ii) a power amplifier connected to the input antenna and adapted to amplify signals at the fundamental frequency from the input antenna;
      (iii) an output antenna cross polarized with the input antenna, the output antenna being tuned to transmit at the fundamental frequency and at a multiple of the fundamental frequency; and
      (iv) a frequency multiplier connected between the power amplifier and the output antenna adapted to generate signals at the multiple of the fundamental frequency;
   b) a frequency selective reflector positioned to reflect signals at the fundamental frequency and to pass signals at the multiple of the fundamental frequency; and
   c) a grating lobe-to-main lobe converter array located between the partial reflector and the array of amplifier devices being constructed to redirect grating lobe power to main lobe power at the multiple of the fundamental frequency.

14. The power source of claim 13 wherein each grating lobe-to-main lobe converter of the grating lobe-to-main lobe converter array comprising least one of: (1) a shaped dielectric; or (2) a patterned material surface.

15. The power source of claim 14 wherein the grating lobe-to-main lobe converter comprises an array of spheroidal lenses positioned above the array of amplifier devices.

16. The power source of claim 15 wherein the grating lobe-to-main lobe converter array comprises hemispherical lenses positioned above the array of amplifier devices.

17. The power source of claim 15 wherein each converter of the array of converters being spaced apart so as to inhibit grating lobes at the fundamental frequency.

18. The power source of claim 15 wherein the grating lobe-to-main lobe converter array is spaced a distance comprising one half wavelength at the fundamental frequency above a respective power source of the array of amplifier devices.

19. The power source of claim 13 wherein the frequency multiplier is a frequency tripler.

20. The power source of claim 13 wherein the output antenna is a single output antenna.

21. The power source of claim 13 wherein the output antenna is spaced with respect to other output antennas of the array of amplifier devices so as to inhibit grating lobes at the fundamental frequency.

22. The power source of claim 13 wherein the output antenna and the input antenna are oriented in a cross polarization configuration.

23. A high frequency quasi optical oscillator power source comprising:
   a) a monolithic grid array of amplifier devices comprising:
      (i) an input antenna tuned to receive an input signal at a fundamental frequency;
      (ii) a power amplifier coupled to the input antenna and constructed to amplify signals at the fundamental frequency;
      (iii) a frequency tripler coupled to the power amplifier capable of providing signals at triple the fundamental frequency and at the fundamental frequency; and
      (iv) an output antenna coupled to the frequency tripler and tuned to radiate signals at the fundamental frequency and at triple the fundamental frequency; and
      (v) the monolithic grid array being configured so as to inhibit grating lobes at the fundamental frequency;
   b) a grating lobe-to-main lobe converter array located above the monolithic grid array being constructed so as to redirect grating lobe power to main lobe power at triple the fundamental frequency and so as to inhibit grating lobes at the fundamental frequency;
   c) a shaped partial reflector located above the monolithic grid array, the partial reflector being adapted to reflect signals at the fundamental frequency and to pass signals at triple the fundamental frequency;
   d) the quasi optical high frequency power source being configured to provide an in-phase synchronized oscillation at the fundamental frequency and to radiate a combined power at triple the fundamental frequency.

24. The power source of claim 23 wherein the grating lobe-to-main lobe converter array comprises at least one of: (a) shaped dielectrics; or (b) a patterned material surface.

25. The power source of claim 24 wherein the grating lobe-to-main lobe converter array comprises spheroidal lenses positioned above the array of amplifier devices.

26. The power source of claim 25 wherein the grating lobe-to-main lobe converter array comprises hemispherical lenses positioned above the array of amplifier devices.

27. The power source of claim 23 wherein the grating lobe-to-main lobe converter array is spaced a distance comprising one half wavelength at the fundamental frequency above a respective power source of the array of amplifier devices.

28. The power source of claim 23 wherein the input and output antennas are positioned to obtain cross polarized input and output signals.

29. The power source of claim 23 wherein the output antenna is a single output antenna.

* * * * *